United States Patent
Ge

(10) Patent No.: US 12,433,176 B2
(45) Date of Patent: Sep. 30, 2025

(54) LARGE-SCALE CROSSBAR ARRAYS WITH REDUCED SERIES RESISTANCE

(71) Applicant: TetraMem Inc., Fremont, CA (US)

(72) Inventor: Ning Ge, Danville, CA (US)

(73) Assignee: TetraMem Inc., San Jose, CA (US)

(*) Notice: Subject to any disclaimer, the term of this patent is extended or adjusted under 35 U.S.C. 154(b) by 524 days.

(21) Appl. No.: 18/052,700

(22) Filed: Nov. 4, 2022

(65) Prior Publication Data

US 2023/0088575 A1 Mar. 23, 2023

Related U.S. Application Data

(62) Division of application No. 16/193,398, filed on Nov. 16, 2018, now Pat. No. 11,532,786.

(51) Int. Cl.
| | |
|---|---|
| *H10N 70/00* | (2023.01) |
| *H10B 63/00* | (2023.01) |
| *H10N 50/80* | (2023.01) |
| *H10N 70/20* | (2023.01) |

(52) U.S. Cl.
CPC .......... *H10N 70/841* (2023.02); *H10B 63/80* (2023.02); *H10N 50/80* (2023.02); *H10N 70/011* (2023.02); *H10N 70/231* (2023.02); *H10N 70/24* (2023.02)

(58) Field of Classification Search
CPC .............................. H10N 70/841; H10B 63/80
See application file for complete search history.

(56) References Cited

U.S. PATENT DOCUMENTS

| | | | |
|---|---|---|---|
| 8,895,953 B1 | 11/2014 | Shields et al. | |
| 9,543,359 B2 | 1/2017 | Lu et al. | |
| 11,532,786 B2 | 12/2022 | Ge | |
| 2008/0080227 A1 | 4/2008 | Duch et al. | |
| 2009/0189141 A1* | 7/2009 | Shin | H10N 70/011 257/4 |
| 2010/0096612 A1* | 4/2010 | Shim | H10N 70/8828 438/102 |
| 2010/0108974 A1* | 5/2010 | Park | H10N 70/231 257/3 |
| 2011/0155991 A1 | 6/2011 | Chen | |
| 2012/0175582 A1* | 7/2012 | Yang | H10N 70/021 257/E47.001 |
| 2014/0124881 A1* | 5/2014 | Kwon | G11C 11/161 257/421 |
| 2015/0129826 A1 | 5/2015 | Wang | |
| 2016/0111642 A1* | 4/2016 | Perniola | G11C 11/161 257/2 |

(Continued)

*Primary Examiner* — Ali Naraghi
(74) *Attorney, Agent, or Firm* — Jaffery Watson Hamilton & DeSanctis LLP

(57) ABSTRACT

Technologies for reducing series resistance are disclosed. An example method may include: forming a first layer on a temporary substrate; forming a second layer on the first layer; etching the first layer and the second layer to form a trench; electroplating a top electrode via the trench, wherein the top electrode partially formed on a top surface of the second layer; removing the first layer and the second layer; forming a curable layer on the temporary substrate and the top electrode; removing the temporary substrate from the curable layer and the top electrode; forming a cross-point device on the curable layer and the top electrode; forming a bottom electrode on the cross-point device; and forming a flexible substrate on the bottom electrode.

5 Claims, 7 Drawing Sheets

(56) References Cited

U.S. PATENT DOCUMENTS

| | | |
|---|---|---|
| 2017/0194057 A1 | 7/2017 | Lee et al. |
| 2020/0152736 A1 | 5/2020 | Yu et al. |
| 2020/0161546 A1 | 5/2020 | Ge |

* cited by examiner ion is a division of U.S. patent application Ser. No. 16/193,398, entitled "Large-Scale Crossbar Arrays with Reduced Series Resistance," filed Nov. 16, 2018, which is hereby incorporated by reference in its entirety.

LARGE-SCALE CROSSBAR ARRAYS WITH REDUCED SERIES RESISTANCE

CROSS REFERENCE TO RELATED APPLICATIONS

This application is a division of U.S. patent application Ser. No. 16/193,398, entitled "Large-Scale Crossbar Arrays with Reduced Series Resistance," filed Nov. 16, 2018, which is hereby incorporated by reference in its entirety.

TECHNICAL FIELD

The present disclosure generally related to reducing series resistance in a crossbar circuit and more specifically to reducing series resistance in a flexible crossbar circuit by using high aspect ratio electrodes manufactured using electroplating and bonding processes.

BACKGROUND

A crossbar circuit may include horizontal electrode rows and vertical electrode columns (or other electrodes) intersecting with each other, with cross-point devices formed at the intersecting points. The crossbar circuit may be used in code comparators, neural networks, or other applications such as wearable devices.

Providing a large-scale crossbar circuit on a flexible substrate and yet low series resistance remains a technical challenge.

SUMMARY

Methods of manufacturing large-scale crossbar arrays with reduced series resistance and more specifically to a design of electrodes and flexible substrate in crossbar circuit are disclosed.

An apparatus comprises: a plurality of top electrodes; and a plurality of cross-point devices connecting the plurality of top electrodes, wherein each of the plurality of top electrodes includes a top portion and a tail portion in a cross-sectional view, wherein the top portion is wider than the tail portion.

In some implementations, the top portion is of a dome shape in a cross-sectional view.

In some implementations, the tail portion is a trapezoid shape in a cross-sectional view.

In some implementations, each of the plurality of top electrodes is of a nail shape in a cross-sectional view.

In some implementations, the plurality of top electrodes includes a plurality of row electrodes and/or column electrodes.

In some implementations, each of the plurality of cross-point devices includes a memristor.

In some implementations, a bottom width of the tail portion is nanoscale to microscale, and a height of each of the plurality of top electrodes is microscale.

In some implementations, a ratio the bottom width of the tail portion to the height of each of the plurality of top electrode is less than 1.

In some implementations, the apparatus further includes a bottom electrode formed on the plurality of cross-point devices.

In some implementations, the apparatus further includes a flexible substrate formed on the bottom electrode.

In some implementations, a material of the flexible substrate includes: polymer, plastic, rubber, resin, or the combination thereof.

In some implementations, the memristor is one of a memristive device, a floating gate, a Phase Change Random Access Memory (PCRAM) device, a Resistive Random-Access Memory (RRAM or ReRAM), a Magnetoresistive Random-Access Memory (MRAM), or other devices with tunable resistance.

A method comprises: forming a first layer on a temporary substrate; forming a second layer on the first layer; etching the first layer and the second layer to form a trench; electroplating a top electrode via the trench, wherein the top electrode partially formed on a top surface of the second layer; removing the first layer and the second layer; forming a curable layer on the temporary substrate and the top electrode; removing the temporary substrate from the curable layer and the top electrode; forming a cross-point device on the curable layer and the top electrode; forming a bottom electrode on the cross-point device; and forming a flexible substrate on the bottom electrode.

In some implementations, the curable layer includes at least one of a heat- or thermal-curable layer, a photo-curable layer, an Ultraviolet (UV) curable layer, a radiation curable layer, or any layer that is capable of turning into a solid phase from a liquid phase.

In some implementations, forming the cross-point device on the curable layer and the top electrode includes: forming the cross-point device; and bonding the cross-point device on the curable layer and the top electrode.

In some implementations, forming the cross-point device on the curable layer and the top electrode further includes: forming a bonding layer on the cross-point device before bonding the cross-point device on the curable layer and the top electrode.

In some implementations, removing the temporary substrate from the curable layer and the top electrode includes peeling the curable layer and the top electrode off the temporary substrate.

BRIEF DESCRIPTION OF THE DRAWINGS

The implementations disclosed herein are illustrated by way of example, and not by way of limitation, in the figures of the accompanying drawings. Like reference numerals refer to corresponding parts throughout the drawings.

DETAILED DESCRIPTION

Systems and methods that are capable of reducing series resistance and providing a flexible substrate in a large-scale crossbar circuit are provided. The technologies described in the present disclosure may provide the following technical advantages. First, the manufacturing process and structural design of row and column electrodes, as described in the present disclosure, may reduce series resistance in a large-scale crossbar circuit Second, the technologies disclosed may improve the yield rate of production and prevent delamination when removing a growing substrate or substituting a growing substrate with a flexible substrate.

Third, the technologies disclosed may provide a transparent covering on a memristor, which allows for tuning the memristor's electrical or optical properties by using light with different wavelengths.

Memristor crossbar circuit arrays may provide technical advantages in applications such as smart wearable electronics. Making large-scale crossbar arrays, however, may be challenging for a variety of reasons. First, processing on a flexible substrate with high accuracy in critical dimension control may be extremely difficult. Second, fabrication of highly conductive electrodes wire is challenging especially when such fabrication occurs on a nanoscale. Third, the flexible substrate also has a limited thermal budget. In order to build large operational crossbar arrays, the electrode resistance needs to be kept quite small. The wire resistance issue deteriorates if high packing density and nanometer features are required. On one hand, a signal propagates along either a column wire or a row wire will degrade with highly resistive wires. On the other hand, the high resistance of a wire will also increase the RC constant so that the charge up of a wire becomes more slowly. The heat generated by highly resistive wires of a crossbar array often does not easily dissipate. Systems and methods for reducing resistance in large-scale crossbar arrays are therefore desired.

Figure 1:
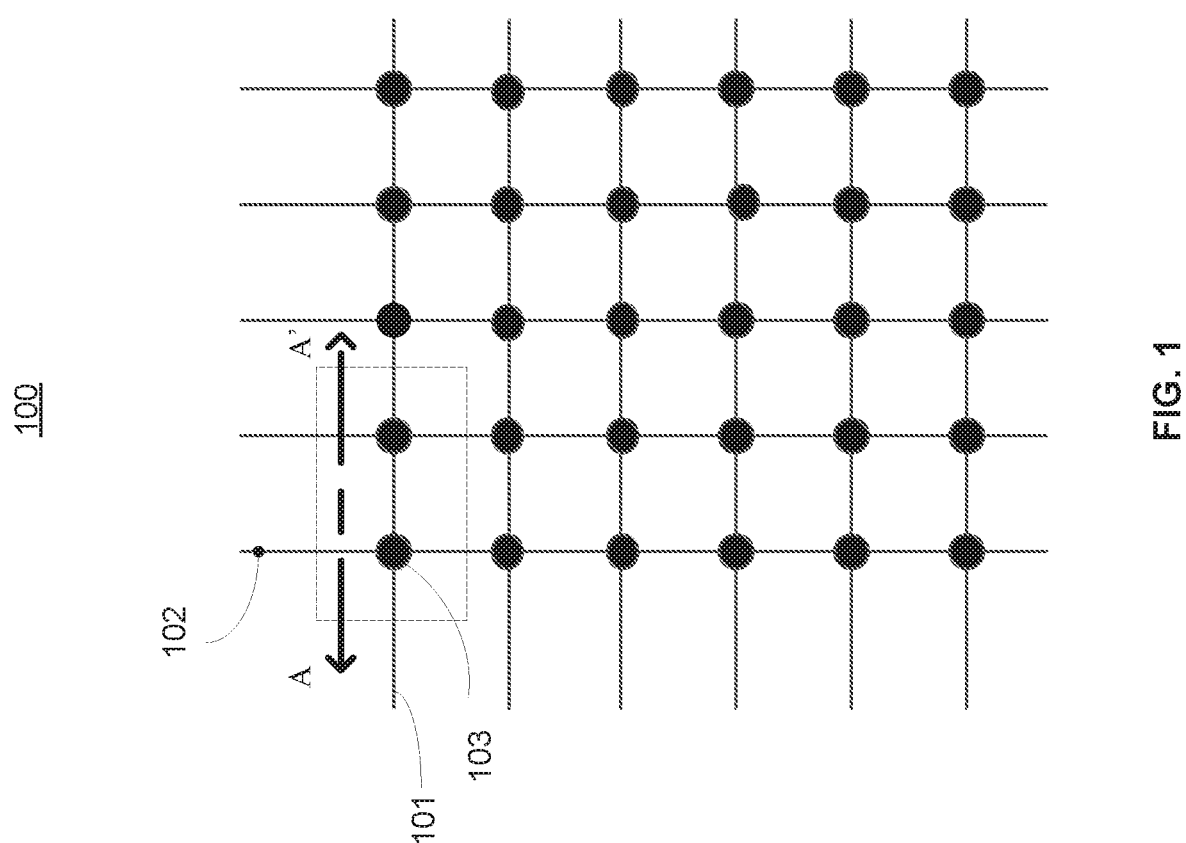
FIG. 1 is a block diagram illustrating an example crossbar circuit in accordance with some embodiments of the present disclosure.

FIG. 1 is a block diagram illustrating an example crossbar circuit 100 with reduced series resistance in accordance with some embodiments of the present disclosure. As shown in FIG. 1, the crossbar circuit 100 includes a first row electrode 101, a first column electrode 102, and a cross-point device 103.

The cross-point device 103 may include a memristor. The memristor, in some implementations, is one of: a memristive device, a floating gate, a Phase Change Random Access Memory (PCRAM) device, a Resistive Random-Access Memory (RRAM or ReRAM), a Magnetoresistive Random-Access Memory (MRAM), or other devices with tunable resistance.

Figure 2:
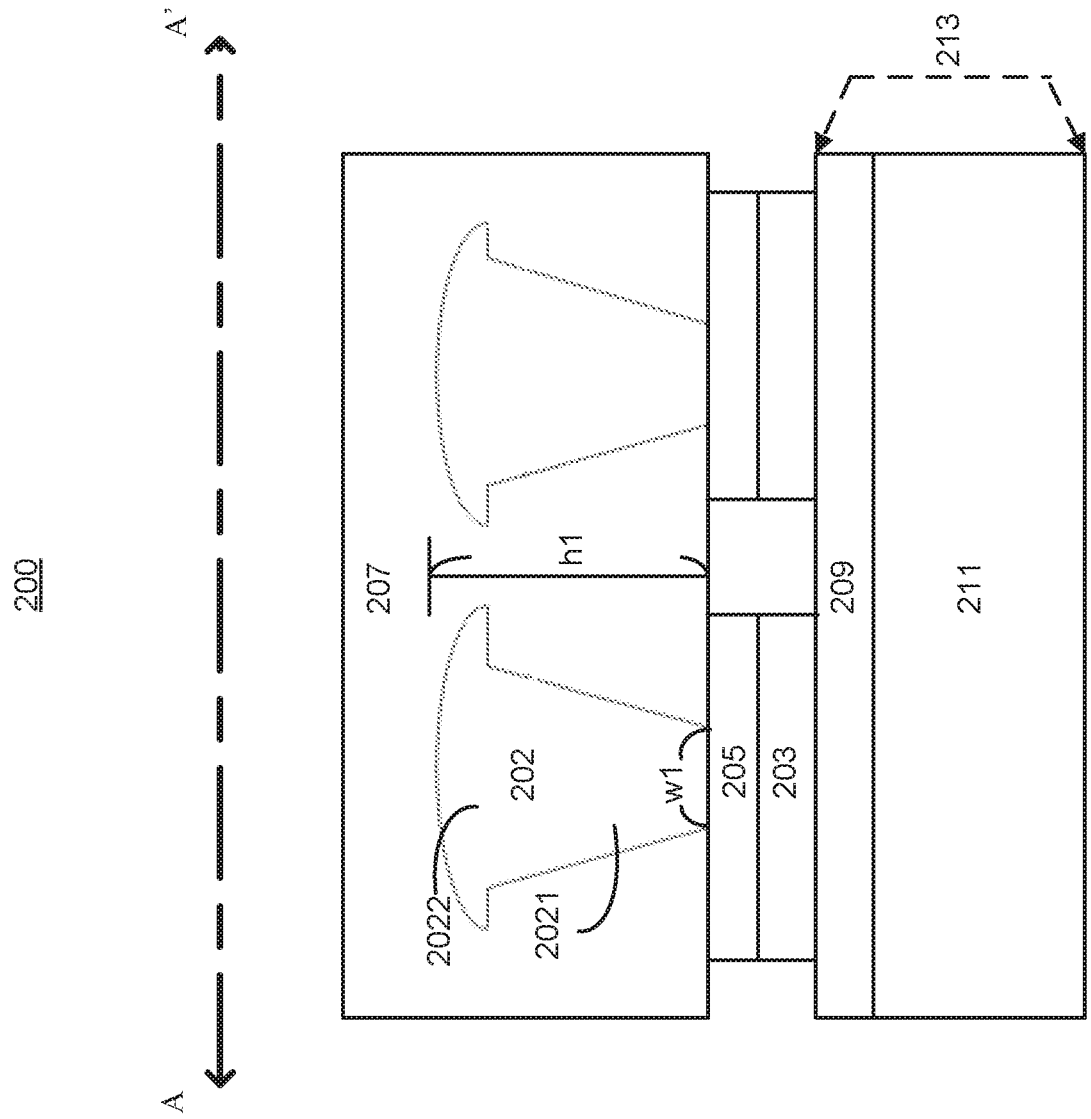
FIG. 2 is a block diagram illustrating a cross-sectional view of a crossbar circuit from the cross-section AA' shown in FIG. 1.

FIG. 2 is a block diagram illustrating a cross-sectional view 200 of the crossbar circuit 100, where the view 200 is shown from the cross-section AA' shown in FIG. 1. The cross-sectional view 200 shows that the crossbar circuit shown in FIG. 1 includes a flexible substrate 211, a bottom electrode 209 formed on the flexible substrate 211, a switching layer 203 formed on the bottom electrode 209, a bonding layer 205 formed on the cross-point device 203, a top electrode 202 formed on the bonding layer 205, and a curable layer 207 formed on the top electrode 202 and the bonding layer 205. The curable layer 207, in some implementations, is one of an Ultraviolet (UV) curable layer, a thermal curable layer, or any layer that is capable of turning into a solid phase from a liquid phase.

In some implementations, the top electrode 202 may be a row electrode such as the first row electrode 101 and/or a column electrode such as the first column electrode 102. In some implementations, the top electrode 202 is the first column electrode 102 and the bottom electrode 209 is the first row electrode 101. In some implementations, the curable layer 207 covers or encapsulates the entire top electrode 202.

As shown in FIG. 2, the top electrode 202 may be of a nail shape and is embedded in the curable layer 207. The nail shape is important for the fabrication process of substituting a growing substrate with a flexible substrate, which will be discussed with reference to FIGS. 3A-3H.

In some implementations, the top electrode 202 includes a top portion 2022 and a tail portion 2021. The top portion 2022, in some implementations, may be of a dome shape, as shown in FIG. 2. The tail portion 2021, in some implementations, may be of a trapezoid shape or a reversed trapezoid shape, as shown in FIG. 2.

In one embodiment of the present disclosure, as shown in FIG. 2, the tail portion 2021 is a reversed trapezoid shape, which includes a bottom width w1 narrower than its top width. Also, a height h1 of the top electrode is a distance ranged from the highest surface of the top portion 2022 to the lowest surface of the tail portion 2021.

In some implementations, the bottom width w1 of the tail portion 2021 is nanoscale to microscale, and the height h1 of each of the plurality of top electrodes 202 is microscale. Nanoscale may be defined as a range between 0.5 nanometers and 500 nanometers; the microscale means 0.5 micrometers to 500 micrometers.

In some implementations, a ratio of the bottom width w1 of the tail portion 2021 to the height h1 of each of the plurality of top electrode 202 may be less than 1. This approach reduces the series resistance from the electrode.

A material of the top electrode 202 includes Cu, Au, Ag, Ni, Sn, or the combination or alloy thereof. A material of the bonding layer 205, in some implementations, may be made of one of In, Pb, Sn, Au, Ag, and alloys thereof. The switching layer 203 may be a blank layer or may be patterned as shown in FIGS. 2 and 3A-3H.

The bottom electrode 209, in some implementations, may be an electrode (e.g., either a row electrode or a column electrode) that connects to the cross-point device 203. The bottom electrode 209 may be the same structure as the top electrode 202 with 90-degree rotation and manufactured with the same process as that for manufacturing the top electrode 202. The bottom electrode 209 may also have the nailed structure and high aspect ratio as the top electrode 202 to in order to provide the desired low resistance.

The flexible substrate 211, in some implementations, is made of polymer, plastic, rubber, resin, or a combination thereof. The curable layer 207, in some implementations, is made of acrylate resin, epoxy resin, or a combination thereof. In some implementations, the curable layer 207 is bendable and transparent. For example, if a Ge2Sb2Te5 (GST) material is used as a switching layer in the memristor of the cross-point device 203, phase change may be locally controlled by using light. The flexible substrate 211 together with the bottom electrode 209 may be collectively referred to as the curable layer 213. The curable layer 213 may have the same structure, composition, and other characteristics as those of the curable layer 207. The curable layer 213 and the curable layer 207 may be identical, but positioned differently, for example, one horizontally and the other vertically. The curable layer 213, in some implementations, covers or encapsulates an array of electrodes embedded within.

FIGS. 3A-3H are block diagrams illustrating a process 300 for fabricating a crossbar circuit according to some embodiments of the present disclosure. FIG. 4. is a flowchart illustrating a method 400 for fabricating the crossbar circuit according to some embodiments of the present disclosure.

Figure 3A:
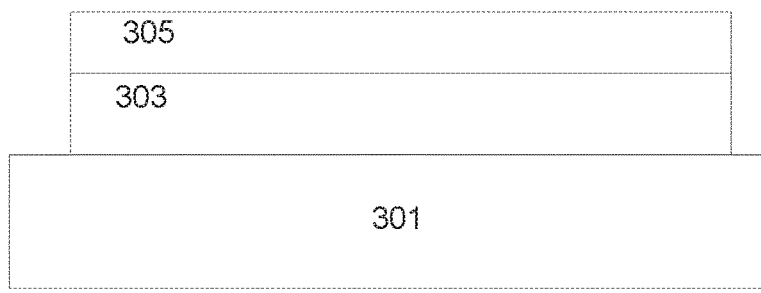
FIGS. 3A-3H are block diagrams illustrating a process for fabricating a crossbar circuit according to some embodiments of the present disclosure.
Figure 4:
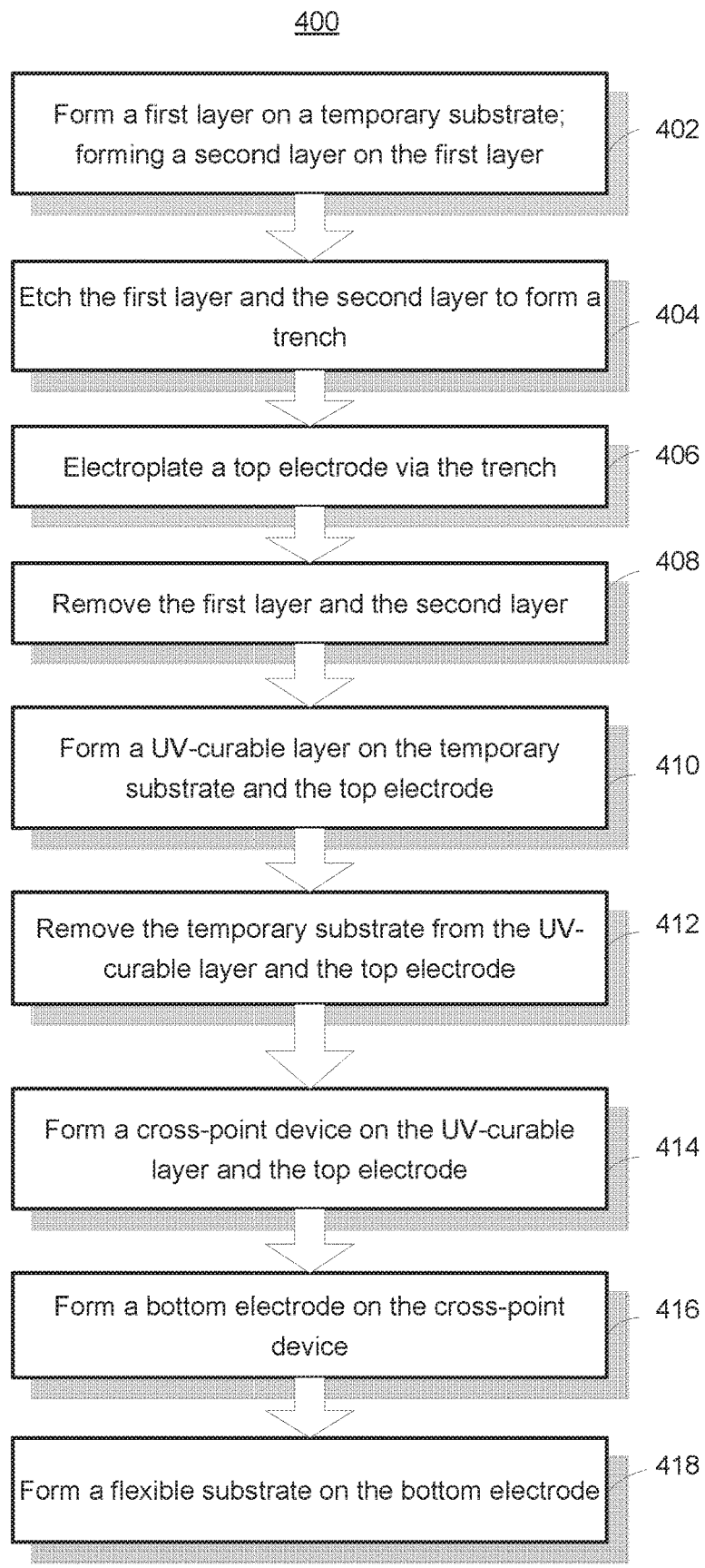
FIG. 4. is a flowchart illustrating a method for fabricating a crossbar circuit according to some embodiments of the present disclosure.

As shown in FIG. 3A, a temporary substrate 301 is provided. In some implementations, the temporary substrate 301 includes silicon, silicon carbide, gallium, sapphire, glass, or any other material that is capable of growing or sustaining other materials throughout the manufacturing process. A first layer 303 may be formed on the temporary substrate 301, and a second layer 305 may be formed on the first layer 303 (step 402). In some implementations, the first layer 303 is a transfer layer, and the second layer 305 is an image layer to enhance the aspect ratio.

Figure 3B:
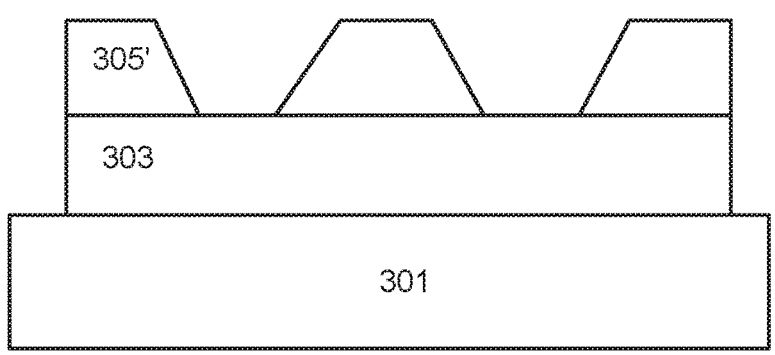
Figure 3C:
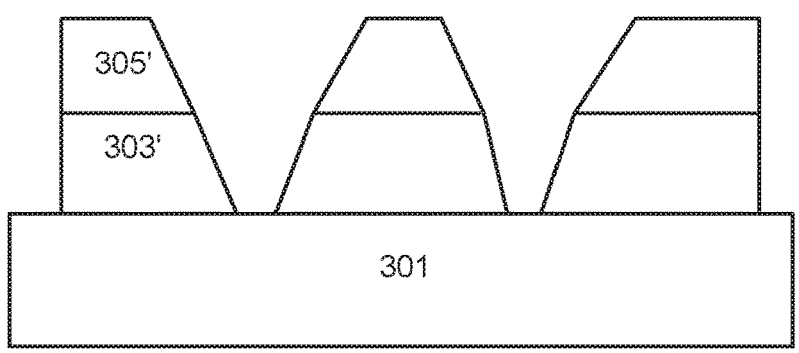
Figure 3C:
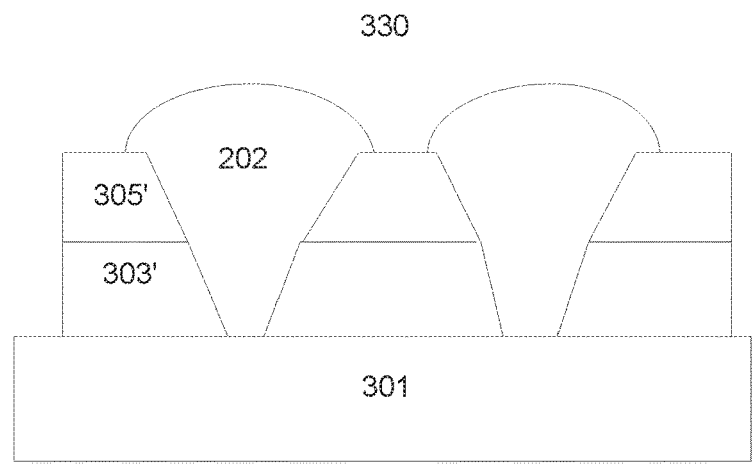

As shown in FIG. 3B, a lithographic process and an etching process may be applied on the second layer 305 and an un-etched portion of second layer 305' is formed. Next, as shown in FIG. 3C, the first layer 303 may be etched in accordance with the pattern of the un-etched portion of second layer 305' to the temporary substrate 301. An un-etched portion of first layer 303' and a trench is formed (step 404).

Figure 3D:
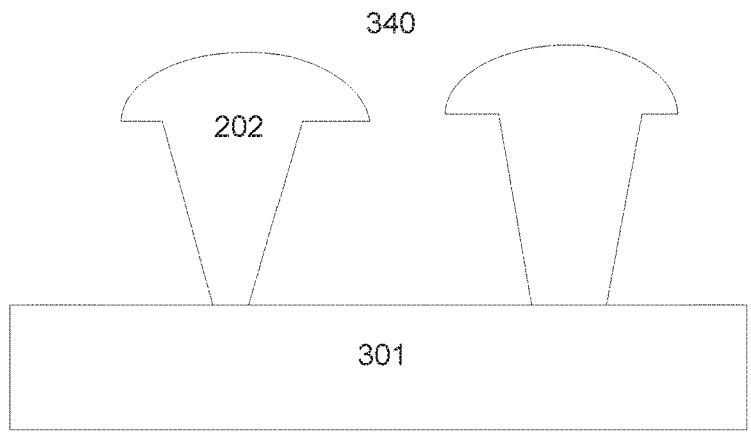

Then, as shown in FIG. 3C, a top electrode 202 is electroplated via the trench and the electroplating is completed when the trench is fully filled (step 406). In some implementations, the top electrode 202 covers a portion (but not all) of the top surface of the second layer 305'. The first layer 303' and the second layer 305' may then be removed with chemicals by wet etching, as shown in FIG. 3D (step 408).

Figure 3E:
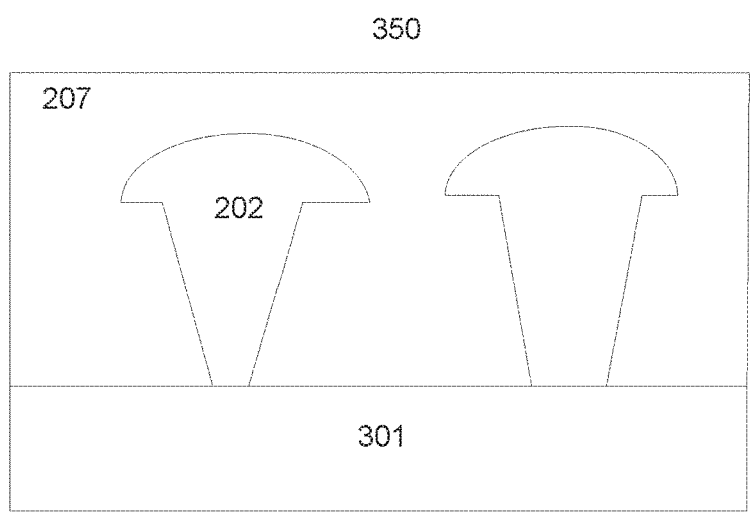

Further, as shown in FIG. 3E, an Ultraviolet-curable layer 207 may be formed on the temporary substrate 301 and the top electrode 202 (step 410). In some implementations, the UV-curable layer 207 is formed by applying a liquid layer on the temporary substrate 301 and the top electrode 202 first, and then solidifying the liquid layer by exposing the liquid layer to Ultraviolet light. The top electrode 202, therefore, is embedded into the curable layer 207 with enough mechanical strength to keep the top electrode 202 in the curable layer 207 during the following substrate transfer process.

Figure 3F:
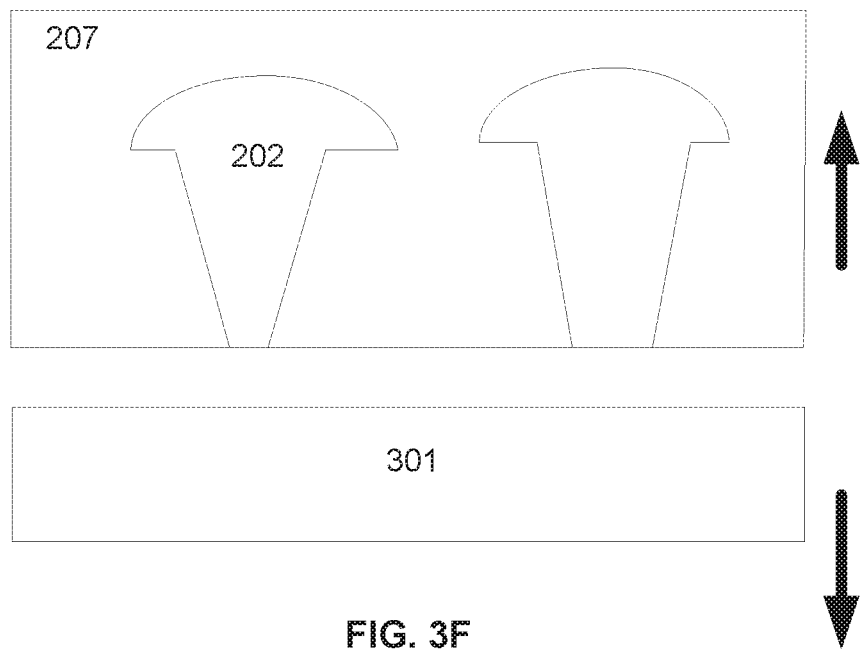

As shown in FIG. 3F, the temporary substrate 301 is removed from the curable layer 207 and the top electrode 202 (step 412). In some implementations, the temporary substrate 301 is removed by peeling the UV-curable layer and the top electrode off the temporary substrate with a high viscosity glue or other wafer transfer techniques. The curable layer 207, as shown in the top portion of FIG. 3F, when flipped over and rotated by 90 degrees, may be used to bond with another curable layer 207 to form a crossbar.

Figure 3G:
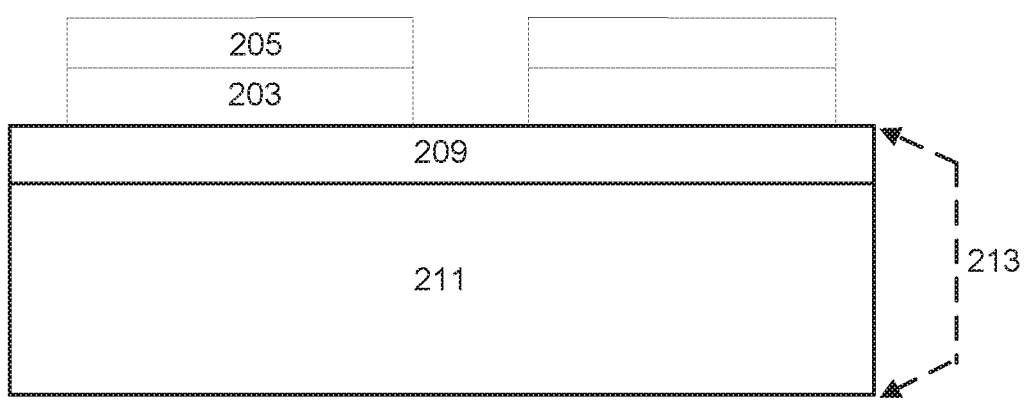

As further illustrated in FIG. 3G, a flexible substrate 211 may be provided; a bottom electrode 209 may be formed on the flexible substrate 211, and a cross-point device 203 may be formed on the bottom electrode 209. In some implementations, a bonding layer 205 may be formed on the cross-point device 203.

Figure 3H:
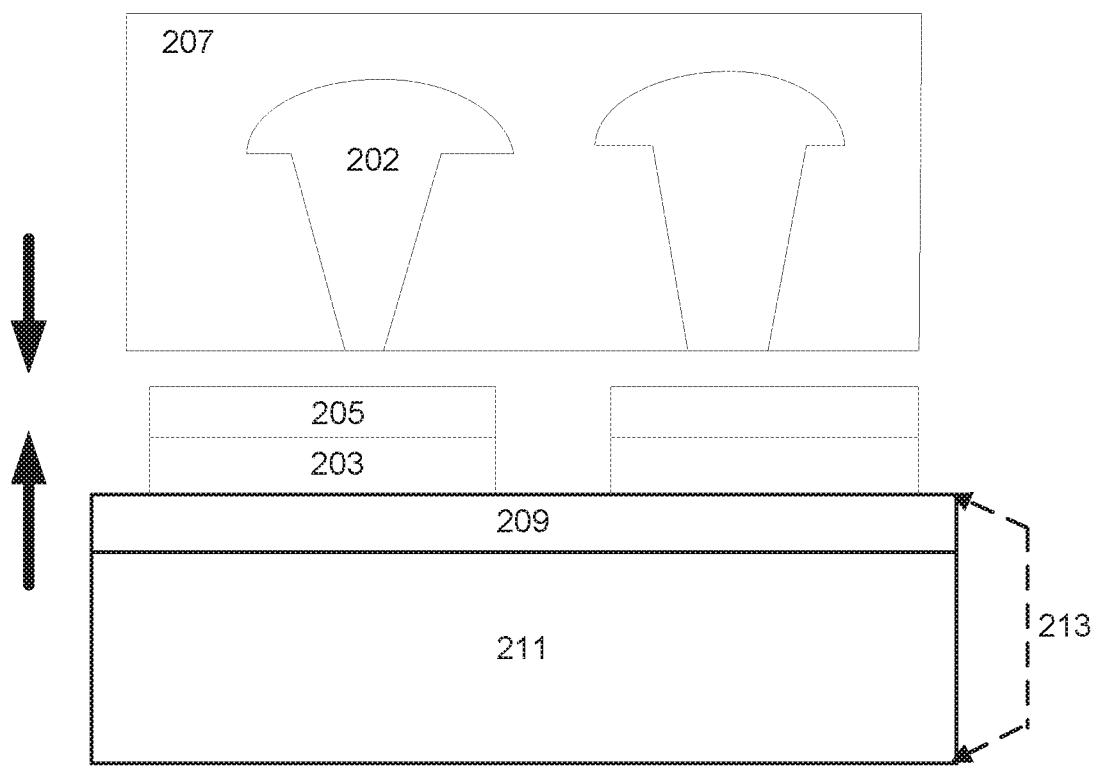

As shown in FIG. 3H, therefore, the cross-point device 203 is attached to and in alignment with the top electrode 202. The cross-point device 203 is formed on the curable layer 207 and the top electrode 202 (step 414). The bottom electrode 209 is formed on the cross-point device 203 (step 416), and the flexible substrate 211 is formed on the bottom electrode 209 (step 418).

A crossbar circuit formed by the process illustrated in FIGS. 3A-3H can operate on a flexible (e.g., bendable or stretchable) surface and provide reduced series resistance.

Further, devices within a crossbar circuit formed this way are flat at the junctions, thereby prolonging the lifetime of the device. The surface of the exposed metal wire is usually quite smooth; as a result, the interface between a switching layer and an electrode are also quite smooth, inheriting the smooth surface from the original carrier substrate (e.g., prime grade silicon).

The Etching step may introduce sloped sidewalls, which usually is to be avoided. Sloped sidewalls are advantageous in the present disclosure because they may provide better anchoring to the transfer resist, which are needed in the steps shown in FIGS. 3F and 3G. The critical dimension lies in the bottom of the trench (as explained with reference to FIG. 3C), which are well controlled by the etching process.

The "nail" structure of the metal after the electroplating (e.g., FIG. 3E) may also improve the mechanical bonding between the flexible substrate layer and the metal electrodes so that delamination is not a concern even during bending of the flexible substrate. The unique metal wire structure will result in low resistance, without increasing the size of the junctions within a crossbar circuit.

The cured UV resist (or other materials) may be bendable or stretchable, as well as transparent, so that a junction can be exposed to light to further tune the device properties. For example, if GST materials are used as the switching layer, phase change could be locally controlled using light.

A designated waveguide may be integrated into each junction to provide individualized control of optical and hence electrical properties at each junction. Driver circuits may be places on a flexible substrate and directly integrated into a crossbar array.

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. A method comprising:
   forming a first layer on a temporary substrate;
   forming a second layer on the first layer;
   etching the first layer and the second layer to form a trench;
   electroplating a top electrode via the trench, wherein the top electrode partially formed on a top surface of the second layer;
   removing the first layer and the second layer;
   forming a curable layer on the temporary substrate and the top electrode;
   removing the temporary substrate from the curable layer and the top electrode;
   forming a cross-point device on the curable layer and the top electrode;
   forming a bottom electrode on the cross-point device; and
   forming a flexible substrate on the bottom electrode.

2. The method of claim 1, wherein the curable layer comprises one of a UV-curable layer, a thermal curable layer, a photo-curable layer, or a radiation-curable layer.

3. The method of claim 1, wherein forming the cross-point device on the curable layer and the top electrode comprises:
   forming the cross-point device; and
   bonding the cross-point device on the curable layer and the top electrode.

4. The method of claim 3, wherein forming the cross-point device on the curable layer and the top electrode further comprises:
   forming a bonding layer on the cross-point device before bonding the cross-point device on the curable layer and the top electrode.

5. The method of claim 1, wherein removing the temporary substrate from the curable layer and the top electrode further comprises:
   peeling the curable layer and the top electrode off the temporary substrate.

* * * * *